United States Patent [19]
Kwak

[11] Patent Number: 6,052,320
[45] Date of Patent: Apr. 18, 2000

[54] INTEGRATED CIRCUIT MEMORY DEVICES HAVING HIGHLY INTEGRATED MERGED DATA TEST CAPABILITY AND METHODS OF TESTING SAME

[75] Inventor: Jin-seok Kwak, Kyungki-do, Rep. of Korea

[73] Assignee: Samsung Electronics Co., Ltd., Rep. of Korea

[21] Appl. No.: 09/123,878

[22] Filed: Jul. 28, 1998

[30] Foreign Application Priority Data

Jul. 29, 1997 [KR] Rep. of Korea ................. 97-35785

[51] Int. Cl.[7] ........................................ G11C 8/00
[52] U.S. Cl. ............................ 365/201; 365/230.06
[58] Field of Search ........................ 365/201, 230.06

[56] References Cited

U.S. PATENT DOCUMENTS 5,561,636 10/1996 Kirihata et al. ..................... 365/201
5,606,528 2/1997 Ikeda ............................. 365/230.01
5,912,899 6/1999 Kim et al. ......................... 365/201

*Primary Examiner*—David Nelms
*Assistant Examiner*—M. Tran
*Attorney, Agent, or Firm*—Myers Bigel Sibley & Sajovec

[57] ABSTRACT

Integrated circuit memory devices having merged data test capability include first and second memory cell arrays in first and second blocks of memory, respectively, a first global input/output line and switches for enabling transfer of data from the first memory cell array to the first global input/output line in response to a first merged data test control signal P1 and enabling transfer of data from the second memory cell array to the first global input/output line in response to a second merged data test control signal P2. A highly integrated merged data test circuit is also provided with test cells therein and each test cell is capable of testing multiple memory cell arrays in at least two blocks of memory. A first merged data test circuit is provided which has a first input electrically coupled to the first global input/output line and a first output which generates first and second error signals upon detection of a failure in the first and second memory cell arrays, respectively.

16 Claims, 7 Drawing Sheets

INTEGRATED CIRCUIT MEMORY DEVICES HAVING HIGHLY INTEGRATED MERGED DATA TEST CAPABILITY AND METHODS OF TESTING SAME

FIELD OF THE INVENTION

The present invention relates to integrated circuit memory devices and methods of testing same.

BACKGROUND OF THE INVENTION

Integrated circuit memory devices may contain both local and global input/output lines for writing and reading data to and from memory arrays therein in an efficient manner. These integrated circuit memory devices may also include conventional merged data test circuits for verifying operability of memory cells in the memory arrays. For example, FIG. 1 is block schematic of a conventional integrated circuit memory device 101 having a plurality of local input/output lines and a plurality of global input/output lines and FIG. 2 is an electrical schematic of a conventional merged data test circuit having inputs electrically connected to the global input/output lines of FIG. 1. For sake of clarity, the local and global input/output lines for transferring complementary data have been omitted from FIG. 1.

In particular, FIG. 1 illustrates a plurality of spaced blocks of memory 111–118 with each block containing a plurality of sub-word line driver circuits 171 and a plurality of memory cell arrays 175, arranged side-by-side as illustrated. As will be understood by those skilled in the art, data can be transferred between local input/output lines 121–124 and the memory cell arrays 175 in the first block of memory 111. Similarly, data can be transferred between local input/output lines 123–126 and the second block of memory 112, between local input/output lines 125–128 and the third block of memory 113, between local input/output lines 127–130 and the fourth block of memory 114, between local input/output lines 129–132 and the fifth block of memory 115, between local input/output lines 131–134 and the sixth block of memory 116, between local input/output lines 133–136 and the seventh block of memory 117, and between local input/output lines 135–138 and the eighth block of memory 118. Global input/output lines 141–156 are also provided so that data can be transferred to and from the local input/output lines and external data pins, for example.

During merged data testing of the first block of memory 111, global input/output lines 141–144 can be electrically connected to local input/output lines 121–124, as illustrated by the dotted connections. Similarly, during merged data testing of the second block of memory 112, global input/output lines 143–146 can be electrically connected to local input/output lines 123–126. Likewise, merged data testing of the third block of memory 113 requires the formation of electrical connections between global input/output lines 145-148 and local input/output lines 125–128, merged data testing of the fourth block of memory 114 requires the formation of electrical connections between global input/output lines 147–150 and local input/output lines 127–130, merged data testing of the fifth block of memory 115 requires the formation of electrical connections between global input/output lines 149–152 and local input/output lines 129–132, merged data testing of the sixth block of memory 116 requires the formation of electrical connections between global input/output lines 151–154 and local input/output lines 131–134, merged data testing of the seventh block of memory 117 requires the formation of electrical connections between global input/output lines 153–156 and local input/output lines 133–136 and merged data testing of the eighth block of memory 118 requires the formation of electrical connections between global input/output lines 155–156 and 141–142 and local input/output lines 135–138.

Referring now to FIG. 2, an electrical schematic of a conventional merged data test circuit is illustrated. This test circuit has inputs electrically connected to the global input/output lines 141–156 of FIG. 1 and outputs electrically connected to test pads 219, 229, 239, 249, 259, 269, 279 and 289. The test circuit also has a plurality of test cells 211, 221, 231, 241, 251, 261, 271 and 281 and each test cell includes a 4-input NOR gate 213, a 4-input AND gate 215 and a 2-input OR gate 217. As will be understood by those skilled in the art, the output of the first test cell 211 will be set to a logic 1 potential whenever global input/output lines 141–144 are all set to logic 0 potentials or all set to logic 1 potentials. Accordingly, the memory cell arrays 175 in the eight blocks of memory 111–118 in FIG. 1 can be individually tested by writing all logic 1 or all logic 0 data into the memory cell arrays 175 and then reading back the written test data via the test circuit. For example, with respect to a memory cell array 175 in the first block 111, data from selected memory cells within four columns of cells may be read onto the first, second, third and fourth local input/output lines 121–124 and then transferred via the first, second, third and fourth global input/output lines 141–144 to the inputs of the first test cell 211. If the first test cell 211 outputs a logic 1 signal to the first test pad 219, then the selected memory cells are functioning correctly with respect to the stored logic 1 or logic 0 data. Similar operations are also performed to test the other memory cell arrays within the other blocks. Thus, with respect to a memory cell array 175 in the second block 112, data from selected memory cells within four columns of cells may be read onto the third, fourth, fifth and sixth local input/output lines 123–126 and then transferred via the third, fourth, fifth and sixth global input/output lines 143–146 to the inputs of the second test cell 221. Based on this configuration, one test cell is required for each block of memory to be tested.

Notwithstanding the above-described integrated circuit memory device having merged data test capability, there continues to be a need for more highly integrated memory devices having improved merged data test circuits therein which are smaller and consume less power.

SUMMARY OF THE INVENTION

It is therefore an object of the present invention to provide improved integrated circuit memory devices and methods of testing same.

It is another object of the present invention to provide integrated circuit memory devices having efficient merged data test circuits therein and methods of testing same.

It is still another object of the present invention to provide integrated circuit memory devices having highly integrated test circuits therein and methods of testing same.

These and other objects, advantages and features of the present invention are provided by integrated circuit memory devices having highly integrated merged data test circuits therein so that each test cell within the test circuit can test memory cell array's in at least two blocks of memory. According to one embodiment of the present invention, a preferred integrated circuit memory device is provided which includes first and second memory cell arrays in first and second blocks of memory, respectively, a first global input/output line and means, electrically coupled to the first and second memory cell arrays, for enabling transfer of data from the first memory cell array to the first global input/ output line in response to a first merged data test control signal P1 and enabling transfer of data from the second memory cell array to the first global input/output line in response to a second merged data test control signal P2. A highly integrated merged data test circuit is also provided with test cells therein and each test cell is capable of testing multiple memory cell arrays in at least two blocks of memory.

In particular, a first merged data test circuit is provided which has a first input electrically coupled to the first global input/output line and a first output which generates first and second error signals upon detection of a failure in the first and second memory cell arrays, respectively. The preferred integrated circuit memory device also includes first and second local input/output lines, a first column select device which electrically connects a first bit line in the first memory cell array to the first local input/output line in response to a first column select signal and a second column select device which electrically connects a first bit line in the second memory cell array to the second local input/output line in response to a second column select signal. The means for enabling transfer also preferably comprises a first switch electrically connected in series between the first local input/ output line and the first global input/output line and a second switch electrically connected in series between the second local input/output line and the first global input/output line. Here, the first and second switches may comprise first and second pass transistors and these first and second pass transistors may have gate electrodes which are responsive to the first and second merged data test control signals P1 and P2, respectively.

According to another embodiment of the present invention, an integrated circuit memory device is provided which includes first, second and third local input/output lines and first and second global input/output lines. First and second memory devices are also provided in respective blocks of memory. The first memory device includes first and second bit lines and a first column select circuit to simultaneously transfer data on the first and second bit lines to the first and second local input/output lines, respectively, in response to a first isolation signal and a column select signal. The second memory device includes third and fourth bit lines and a column select circuit to simultaneously transfer data on the third and fourth bit lines to the second and third local input/output lines, respectively, in response to a second isolation signal and the column select signal. A merged data test circuit is also provided having first and second inputs electrically coupled to the first and second global input/output lines. In addition, means is provided for electrically connecting the first and second local input/ output lines to the first and second global input/output lines, respectively, during a first merged data test time interval, and electrically connecting the second and third local input/ output lines to the first and second global input/output lines, respectively, during a second merged data test time interval. Here, the electrically connecting means preferably includes first and second pass transistors electrically connected in series between the first and second local input/output lines and the first and second global input/output lines, respectively, and third and fourth pass transistors electrically connected in series between the second and third local input/output lines and the first and second global input/ output lines, respectively. The first and second pass transistors also have gate electrodes electrically connected to a first control signal line P1 and the third and fourth pass transistors have gate electrodes electrically connected to a second control signal line P2.

According to still another embodiment of the present invention, a method of performing a merged data test is provided which comprises the steps of transferring data from first and second bit lines in the first memory cell array to the first and second local input/output lines, respectively, while simultaneously electrically connecting the first and second local input/output lines to the first and second global input/ output lines, during a first merged data test time interval; and transferring data from first and second bit lines in the second memory cell array to the second and third local input/output lines, respectively, while simultaneously electrically connecting the second and third local input/output lines to the first and second global input/output lines, during a second merged data test time interval.

DESCRIPTION OF PREFERRED EMBODIMENTS

The present invention will now be described more fully hereinafter with reference to the accompanying drawings, in which preferred embodiments of the invention are shown.

This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
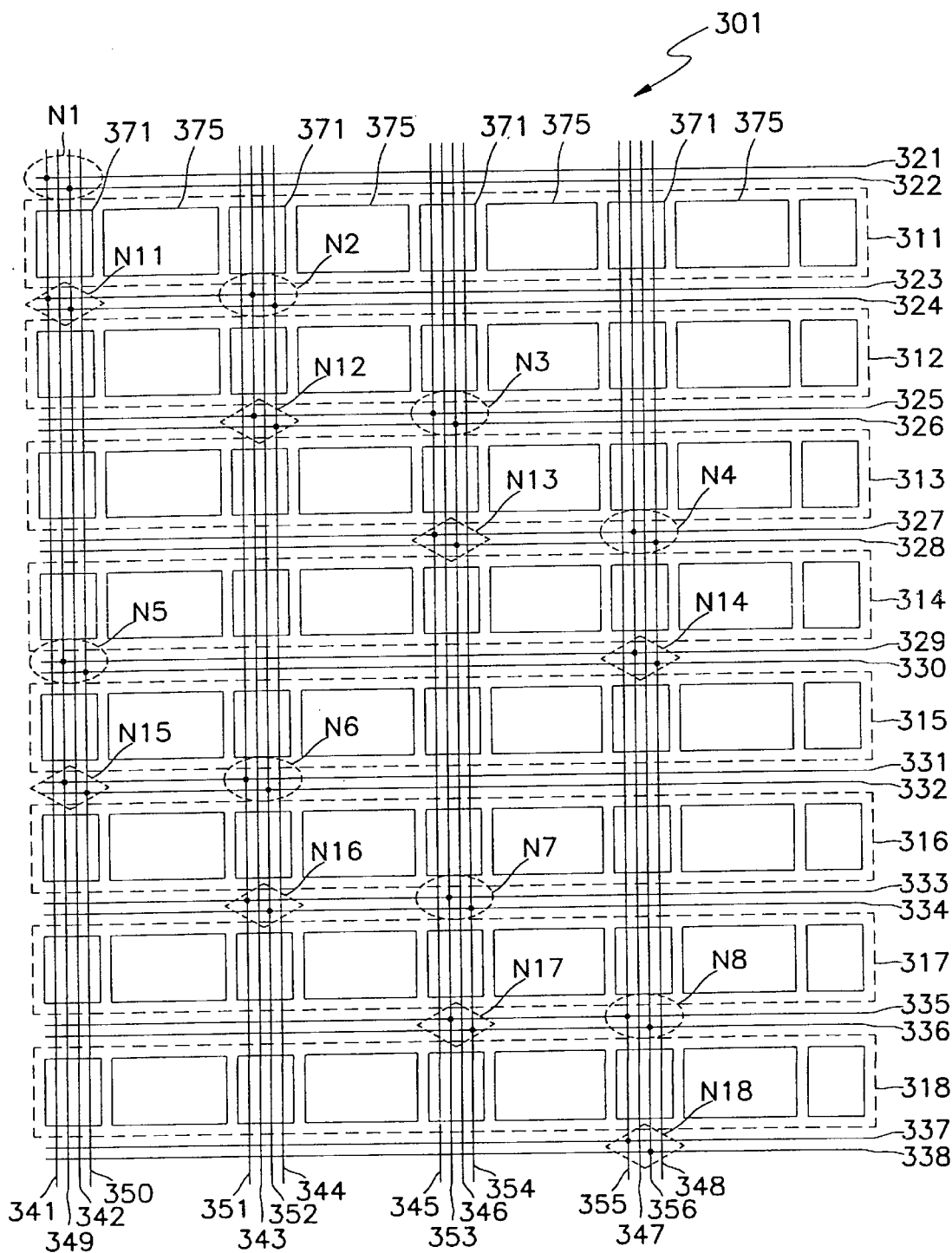
FIG. 3 is a block schematic of an integrated circuit memory device according to a first embodiment of the present invention.

Referring now to FIG. 3, a block schematic of an integrated circuit memory device 301 according to a first embodiment of the present invention will be described. In particular, FIG. 3 illustrates a plurality of spaced blocks of memory 311–318 with each block containing a plurality of sub-word line driver circuits 371 and a plurality of memory cell arrays 375, arranged side-by-side as illustrated. As described more fully hereinbelow with respect to FIG. 9, data can be transferred between local input/output lines 321–324 and the memory cell arrays 375 in the first block of memory 311. Similarly, data can be transferred between local input/output lines 323–326 and the second block of memory 312, between local input/output lines 325–328 and the third block of memory 313, between local input/output lines 327–330 and the fourth block of memory 314, between local input/output lines 329–332 and the fifth block of memory 315, between local input/output lines 331–334 and the sixth block of memory 316, between local input/output lines 333–336 and the seventh block of memory 317, and between local input/output lines 335–338 and the eighth block of memory 318. Global input/output lines 341–356 are also provided so that data can be transferred from the eighteen local input/output lines 321–338 to a merged data test circuit, for example.

As described more fully hereinbelow, during merged data testing of the first block of memory 311, global input/output lines 341–344 can be electrically connected to local input/output lines 321–324 at nodes N1 and N2, as illustrated. Similarly, during merged data testing of the second block of memory 312, global input/output lines 341–344 can also be electrically connected to local input/output lines 323–326 at nodes N11 and N12. Likewise, merged data testing of the third block of memory 313 requires the formation of electrical connections between global input/output lines 345–348 and local input/output lines 325–328 at nodes N3 and N4, merged data testing of the fourth block of memory 314 requires the formation of electrical connections between global input/output lines 345–348 and local input/output lines 327–330 at nodes N13 and N14, merged data testing of the fifth block of memory 315 requires the formation of electrical connections between global input/output lines 349–352 and local input/output lines 329–332 at nodes N5 and N6, merged data testing of the sixth block of memory 316 requires the formation of electrical connections between global input/output lines 349–352 and local input/output lines 331–334 at nodes N15 and N16, merged data testing of the seventh block of memory 317 requires the formation of electrical connections between global input/output lines 353–356 and local input/output lines 333–336 at nodes N7 and N8 and merged data testing of the eighth block of memory 318 requires the formation of electrical connections between global input/output lines 353–356 and local input/output lines 335–338 at nodes N17 and N18.

Figure 1:
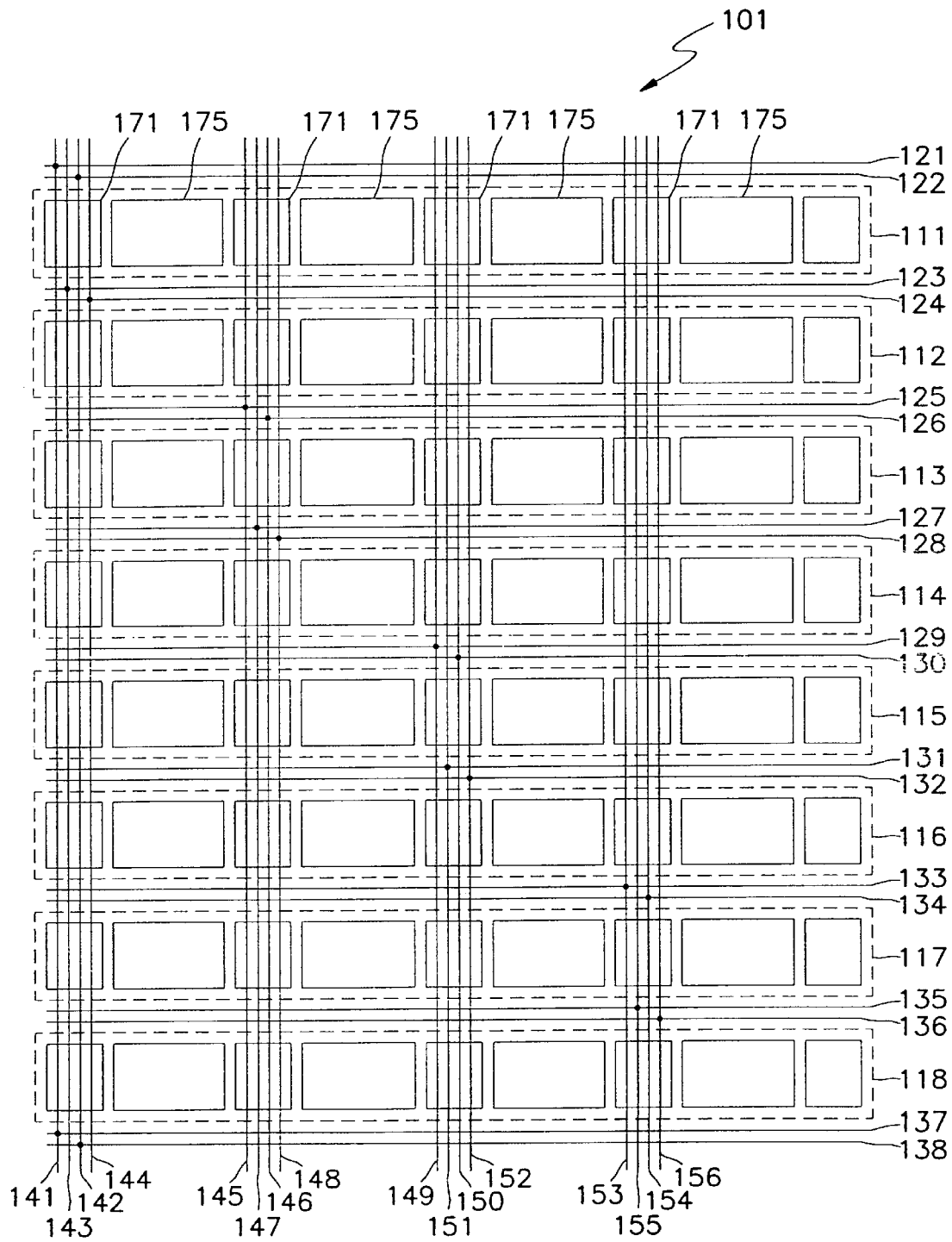
FIG. 1 is block schematic of a conventional integrated circuit memory device having eighteen local input/output lines 121–138 and sixteen global input/output lines 141–156.
Figure 2:
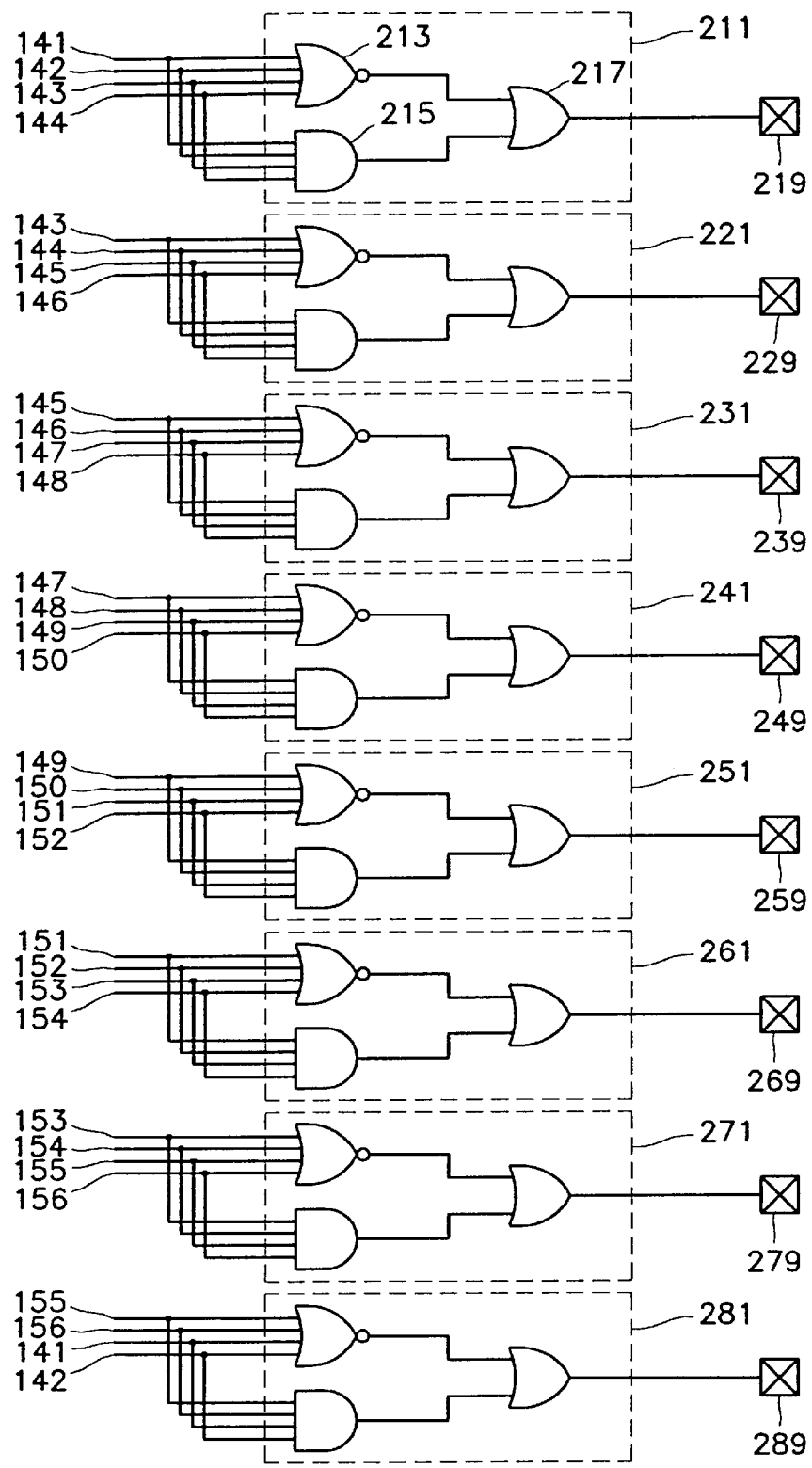
FIG. 2 is an electrical schematic of a conventional merged data test circuit having inputs electrically connected to the global input/output lines of FIG. 1.
Figure 4:
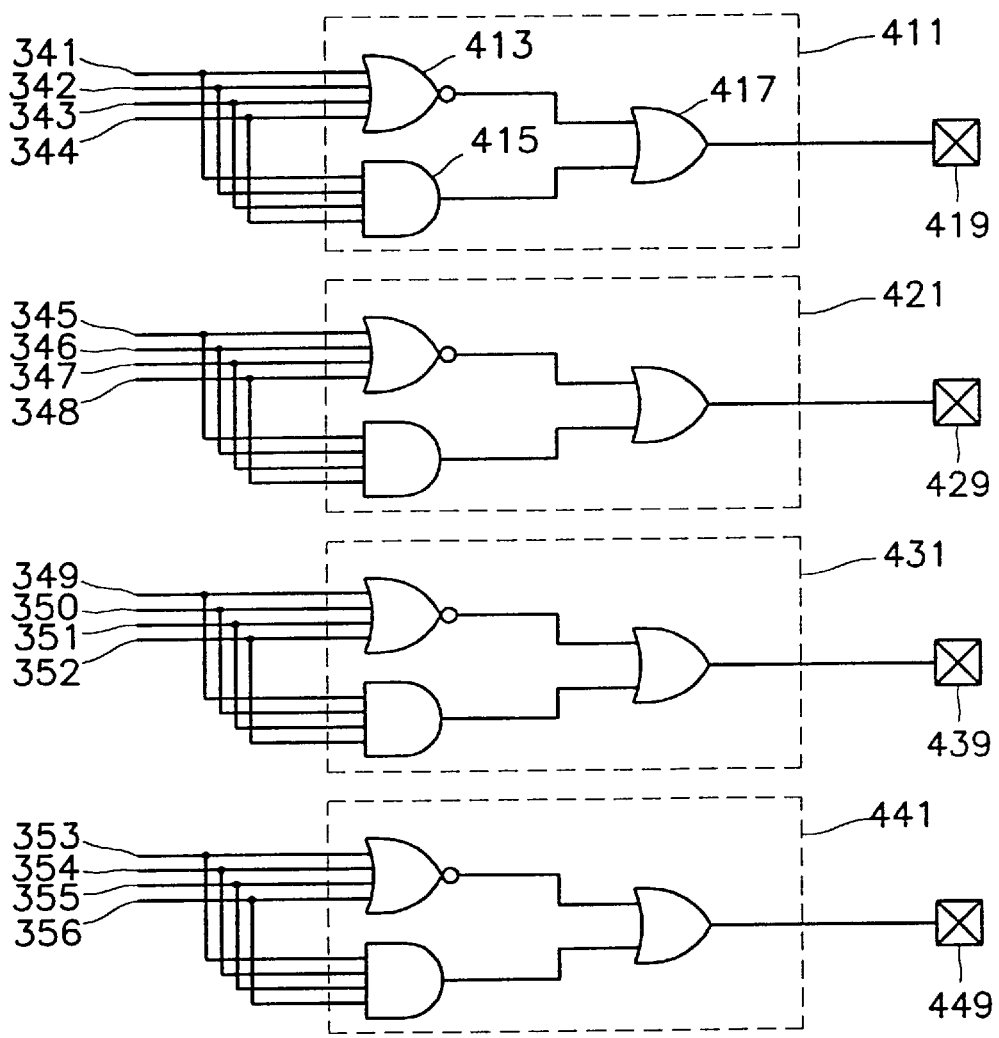
FIG. 4 is an electrical schematic of a merged data test circuit according to a preferred aspect of the present invention.

Referring now to FIG. 4, an electrical schematic of a preferred merged data test circuit is illustrated. This test circuit, which is half the size of the conventional test circuit of FIG. 2 because it has only four test cells 411, 421, 431 and 441 instead of eight test cells, has inputs electrically connected to the global input/output lines 341–356 of FIG. 3 and outputs electrically connected to test pads 419, 429, 439 and 449. As illustrated, each test cell includes a 4-input NOR gate 413, a 4-input AND gate 415 and a 2-input OR gate 417. As will be understood by those skilled in the art, the output of the first test cell 411 will be set to a logic 1 potential whenever global input/output lines 341–344 are all set to logic 0 potentials or all set to logic 1 potentials. Otherwise, the output of the first test cell 411 will be set to a logic 0 potential. Acordingly, the memory cell arrays 375 in the eight blocks of memory 311–318 in FIG. 3 can be individually tested by writing all logic 1 or all logic 0 data into the memory cell arrays 375 and then reading back the written test data on the appropriate local and global input/output lines so that the test circuit can verify operability of the memory cell arrays. For example, with respect to a memory cell array 375 in the first block 311, data from selected memory cells within four columns of cells may be read onto the first, second, third and fourth local input/output lines 321–324 and then transferred at nodes N1 and N2 to the first, second, third and fourth global input/output lines 341–344 and to the inputs of the first test cell 411. If the first test cell 411 outputs a logic 1 signal to the first test pad 419, then the four selected memory cells are functioning correctly with respect to the stored logic 1 or logic 0 data. Similar operations are also performed to test the other memory cell arrays within the other blocks. Thus, with respect to a memory cell array 375 in the second block 312, data from selected memory cells within four columns of cells therein may be read onto the third, fourth, fifth and sixth local input/output lines 323–326 and then transferred at nodes N11 and N12 to the first, second, third and fourth global input/output lines 341–344 and to the inputs of the first test cell 411. Based on this configuration, only one test cell is required for each pair of blocks of memory to be tested.

Now, as described more fully hereinbelow with respect to FIGS. 5–8, the electrical connections between the first through sixteenth local input/output lines 321–336 and the sixteen global input/output lines 341–356 at nodes N1–N8 (illustrated by black dots) are formed by a first plurality of switches (e.g., pass transistors) and these switches are responsive to a first merged data test control signal P1. However, the electrical connections between the third through eighteenth local input/output lines 323–338 and the same sixteen global input/output lines 341–356 at nodes N1–N18 (illustrated by black dots) are formed by a plurality of switches (e.g., pass transistors) and these switches are responsive to a second merged data test control signal P2. Accordingly, the use of a plurality of switches and respective control signals enables the use of a fewer number of test cells in the merged data test circuit of FIG. 4.

Figure 5:
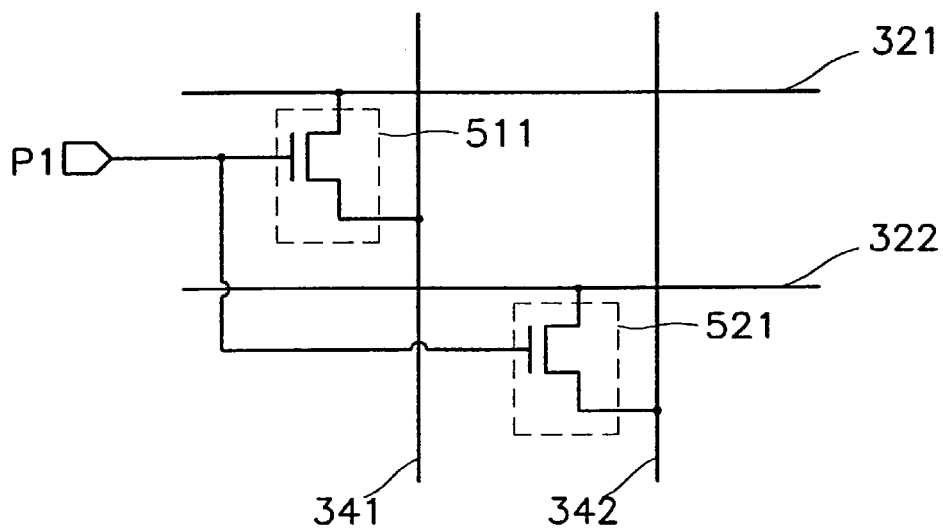
FIG. 5 is an electrical schematic of a pair of pass transistors at node N1 which electrically connect a first local input/output line 321 to a first global input/output line 341 and electrically connect a second local input/output line 322 to a second global input/output line 342, in response to a first merged data test control signal P1.
Figure 6:
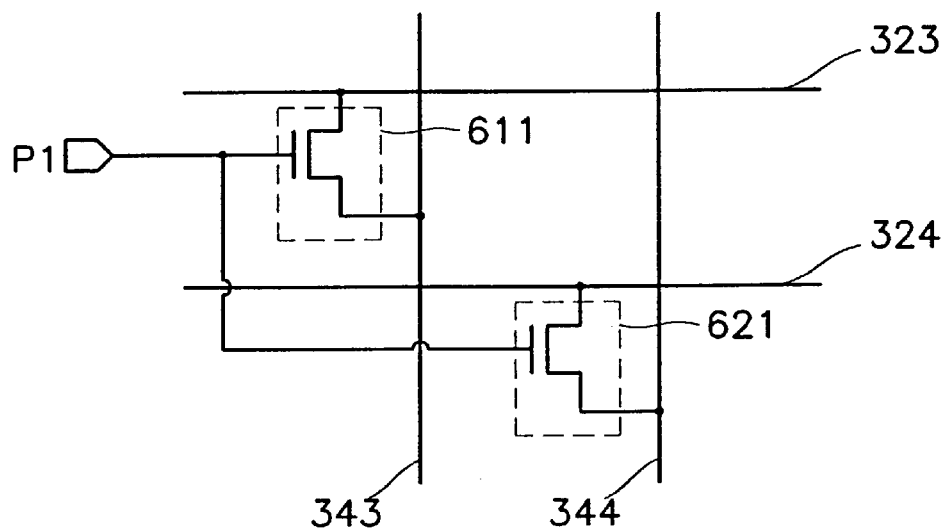
FIG. 6 is an electrical schematic of a pair of pass transistors at node N2 which electrically connect a third local input/output line 323 to a third global input/output line 343 and electrically connect a fourth local input/output line 324 to a fourth global input/output line 344, in response to a first merged data test control signal P1.

Referring now to FIG. 5, pass transistors 511 and 521 are electrically connected in series between local input/output line 321 and global input/output line 341 and between local input/output line 322 and global input/output line 342, respectively. These pass transistors 511 and 521 have gate electrodes which are responsive to a first merged data test control signal P1. Similarly, with respect to FIG. 6, pass transistors 611 and 621 are electrically connected in series between local input/output line 323 and global input/output line 343 and between local input/output line 324 and global input/output line 344, respectively. These pass transistors 611 and 621 have gate electrodes which are responsive to the first merged data test control signal P1.

Figure 7:
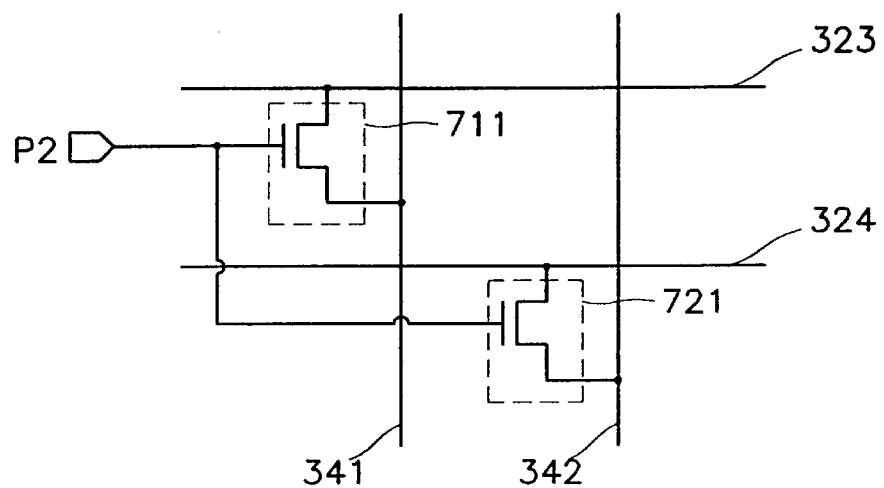
FIG. 7 is an electrical schematic of a pair of pass transistors at node N11 which electrically connect the third local input/output line 323 to the first global input/output line 341 and electrically connect the fourth local input/ output line 324 to the second global input/output line 342, in response to a second merged data test control signal P2.
Figure 8:
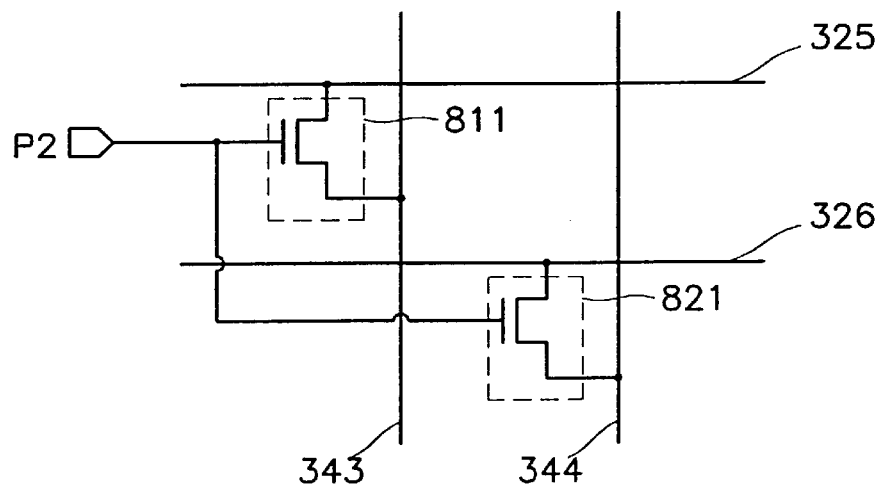
FIG. 8 is an electrical schematic of a pair of pass transistors at node N12 which electrically connect a fifth local input/output line 325 to the third global input/output line 343 and electrically connect a sixth local input/output line 326 to a fourth global input/output line 344, in response to a second merged data test control signal P2.

Referring now to FIG. 7, pass transistors 711 and 721 are electrically connected in series between local input/output line 323 and global input/output line 341 and between local input/output line 324 and global input/output line 342, respectively. These pass transistors 711 and 721 have gate electrodes which are responsive to a second merged data test control signal P2. Similarly, with respect to FIG. 8, pass transistors 811 and 821 are electrically connected in series between local input/output line 325 and global input/output line 343 and between local input/output line 326 and global input/output line 344, respectively. These pass transistors 811 and 821 have gate electrodes which are responsive to the second merged data test control signal P2.

Accordingly, the use of pass transistors at nodes N1–N8 enables the simultaneous testing of memory cells (e.g., four memory cells) in each of the first, third, fifth and seventh blocks of memory 311, 313, 315 and 317 and the use of pass transistors at nodes N11–N18 enables the simultaneous testing of memory cells in each of the second, fourth, sixth and eighth blocks of memory 312, 314, 316 and 318. Moreover, the use of a plurality of merged data test control signals (e.g., P1 and P2) in combination with the respective pairs of pass transistors enables the use of a smaller merged data test circuit, as illustrated by FIG. 4.

Figure 9:
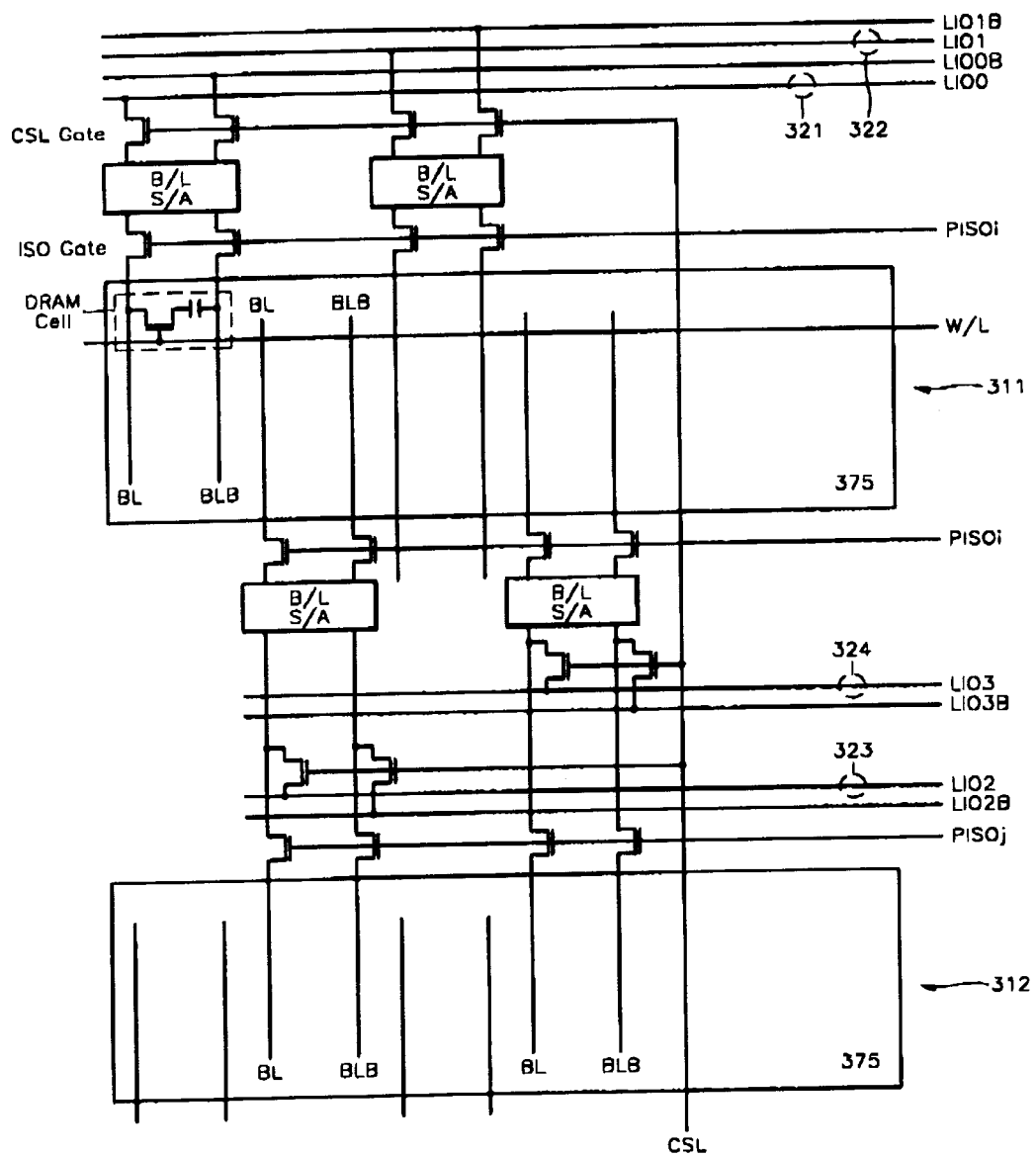
FIG. 9 is an electrical schematic of a preferred integrated circuit memory device having circuits therein for electrically connecting pairs of differential bit lines BL and BLB to respective pairs of differential local input/output lines LIOn and LIOnB, in response to a column select signal CSL and corresponding isolation signals PISOi, PIOSj.

Referring now to FIG. 9, an electrical schematic is provided of a preferred integrated circuit memory device having circuits therein for electrically connecting pairs of differential bit lines BL and BLB to respective pairs of differential local input/output lines LIOn and LIOnB, in response to a column select signal CSL and corresponding isolation signals PISOi, PIOSj. Here, the application of a logic 1 column select signal CSL, a logic 1 signal on the word line W/L, a logic 1 first isolation signal PISOi and a logic 0 second isolation signal PISOj can be used to enable transfer of four bits of data from respective bit lines BL in a memory cell array 375 within the first block of memory 311, to the first, second, third and fourth local input/output lines 321–324. As will be understood by those skilled in the art, this data transfer from memory cells (e.g., DRAM cells) within a memory cell array to local input/output lines is preferably performed with the aid of a bit line sense amplifier (B/L S/A). The four bits of data on the first-fourth local input/output lines 321–324 can then be transferred at nodes N1 and N2 to the first-fourth global input/output lines 341–344 and to the first test cell 411 using the switches of FIGS. 5–6. Likewise, the application of a logic 1 column select signal CSL, a logic 1 signal on another word line W/L, a logic 0 first isolation signal PISOi and a logic 1 second isolation signal PISOj can be used to enable transfer of four bits of data from respective bit lines BL in a memory cell array 375 within the second block of memory 312, to the third, fourth, fifth and sixth local input/output lines 323–326. These four bits of data on the third, fourth, fifth and sixth local input/output lines 323–326 can then be transferred to the first-fourth global input/output lines 341–344 and the first test cell 411 using the switches of FIGS. 7–8.

Thus, according to a preferred embodiment of the present invention, an integrated circuit memory device is provided which includes first, second and third local input/output lines (e.g., 321, 323 and 325) and first and second global input/output lines (e.g., 341 and 343). First and second memory devices 375 are also provided in respective blocks of memory (e.g., 311 and 312). The first memory device includes first and second bit lines and a first column select circuit (CSL gate) to simultaneously transfer data on the first and second bit lines to the first and second local input/output lines (e.g., 321 and 323), respectively, in response to a first isolation signal PISOi and a column select signal CSL. The second memory device includes third and fourth bit lines and a column select circuit to simultaneously transfer data on the third and fourth bit lines to the second and third local input/output lines (e.g., 323 and 325), respectively, in response to a second isolation signal PISOj and the column select signal CSL. A merged data test circuit (e.g., cell 411) is also provided having first and second inputs electrically coupled to the first and second global input/output lines (e.g., 341 and 343). In addition, means is provided for electrically connecting the first and second local input/output lines to the first and second global input/output lines, respectively, during a first merged data test time interval, and electrically connecting the second and third local input/output lines to the first and second global input/output lines, respectively, during a second merged data test time interval. Here, the electrically connecting means preferably includes first and second pass transistors (e.g., 511 and 611) electrically connected in series between the first and second local input/output lines and the first and second global input/output lines, respectively, and third and fourth pass transistors (e.g., 711 and 811) electrically connected in series between the second and third local input/output lines and the first and second global input/output lines, respectively. The first and second pass transistors also have gate electrodes electrically connected to a first control signal line P1 and the third and fourth pass transistors have gate electrodes electrically connected to a second control signal line P2.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second memory cell arrays in first and second blocks of memory, respectively;
   a first local input/output line:
   a first global input/output line;
   means, electrically coupled to said first and second memory cell arrays, for enabling transfer of data from said first memory cell array to said first global input/output line in response to a first merged data test control signal and enabling transfer of data from said second memory cell array to said first global input/output line in response to a second merged data test control signal, said means for enabling transfer comprising a first switch electrically connected in series between said first local input/output line and said first global input/output line; and
   a first merged data test circuit having a first input electrically coupled to said first global input/output line and a first output which generates first and second error signals upon detection of a failure in said first and second memory cell arrays, respectively.

2. The memory device of claim 1, further comprising:
   a first column select device which electrically connects a first bit line in said first memory cell array to said first local input/output line in response to a first column select signal.

3. The memory device of claim 2, further comprising:
   a second local input/output line;
   a second column select device which electrically connects a first bit line in said second memory cell array to said second local input/output line in response to a second column select signal; and
   wherein said means for enabling transfer comprises a second switch electrically connected in series between said second local input/output line and said first global input/output line.

4. The memory device of claim 3, wherein said merged data test circuit comprises a multi-input NOR gate having a first input electrically connected to said first global input/output line and a multi-input AND gate having a first input electrically connected to said first global input/output line.

5. The memory device of claim 4, wherein the first and second switches comprise first and second pass transistors, respectively, and wherein the first and second pass transistors have respective gate electrodes which are responsive to the first and second merged data test control signals, respectively.

6. The memory device of claim 3, wherein the first and second switches comprise first and second pass transistors, respectively, and wherein the first and second pass transistors have respective gate electrodes which are responsive to the first and second merged data test control signals, respectively.

7. The memory device of claim 3, wherein the first column select device electrically connects a second bit line in said first memory cell array to said second local input/output line in response to the first column select signal; wherein said means for enabling transfer comprises a third switch electrically connected in series between said second local input/output line and said second global input/output line; and wherein third switch is responsive to the first merged data test control signal.

8. The memory device of claim 5, further comprising a second global input/output line; wherein the multi-input NOR gate has a second input electrically connected to said second global input/output line; and wherein the multi-input AND gate has a second input electrically connected to said second global input/output line.

9. The memory device of claim 8, wherein said first and second memory cell arrays are spaced side-by-side on a substrate; wherein said first global input/output line extends opposite a first end of said first and second memory cell arrays; and wherein said second global input/output line extends opposite a second end of said first and second memory cell arrays.

10. The memory device of claim 9, wherein the first column select device electrically connects a second bit line in said first memory cell array to said second local input/output line in response to the first column select signal; wherein said means for enabling transfer comprises a third switch electrically connected in series between said second local input/output line and said second global input/output line; and wherein third switch is responsive to the first merged data test control signal.

11. An integrated circuit memory device, comprising:

first, second and third local input/output lines;

first and second global input/output lines;

a first memory device including first and second bit lines and a first column select circuit to simultaneously transfer data on the first and second bit lines to the first and second local input/output lines, respectively, in response to a first isolation signal and a column select signal;

a second memory device including third and fourth bit lines and a column select circuit to simultaneously transfer data on the third and fourth bit lines to the second and third local input/output lines, respectively, in response to a second isolation signal and the column select signal;

a merged data test circuit having first and second inputs electrically coupled to said first and second global input/output lines; and means for electrically connecting said first and second local input/output lines to said first and second global input/output lines, respectively, during a first merged data test time interval, and electrically connecting said second and third local input/output lines to said first and second global input/output lines, respectively, during a second merged data test time interval.

12. The memory device of claim 11, wherein said merged data test circuit comprises a multi-input NOR gate having first and second inputs electrically connected to said first and second global input/output lines and a multi-input AND gate having first and second inputs electrically connected to said second global input/output line.

13. The memory device of claim 11, wherein said electrically connecting means comprises:

first and second pass transistors electrically connected in series between said first and second local input/output lines and said first and second global input/output lines, respectively; and third and fourth pass transistors electrically connected in series between said second and third local input/output lines and said first and second global input/output lines, respectively.

14. The memory device of claim 13, wherein the first and second pass transistors have gate electrodes electrically connected to a first control signal line; and wherein the third and fourth pass transistors have gate electrodes electrically connected to a second control signal line.

15. The memory device of claim 14, wherein said merged data test circuit comprises;

a multi-input NOR gate having first and second inputs electrically connected to said first and second global input/output lines;

a multi-input AND gate having first and second inputs electrically connected to said second global input/output line; and a multi-input OR gate having first and second inputs electrically connected to an output of the multi-input NOR gate and an output of the multi-input AND gate, respectively.

16. In an integrated circuit memory device containing first and second memory cell arrays in first and second blocks of memory, respectively, first, second and third local input/output lines, first and second global input/output lines and a merged data test circuit having inputs electrically coupled to the first and second global input/output lines, a method of performing a merged data test, comprising the steps of:

transferring data from first and second bit lines in the first memory cell array to the first and second local input/output lines, respectively, while simultaneously electrically connecting the first and second local input/output lines to the first and second global input/output lines, during a first merged data test time interval; and transferring data from first and second bit lines in the second memory cell array to the second and third local input/output lines, respectively, while simultaneously electrically connecting the second and third local input/output lines to the first and second global input/output lines, during a second merged data test time interval.

* * * * *